(12) United States Patent
Tanaka

(10) Patent No.: US 7,736,839 B2
(45) Date of Patent: Jun. 15, 2010

(54) PROCESS FOR FABRICATING SEMICONDUCTOR DEVICE AND METHOD FOR GENERATING MASK PATTERN DATA

(75) Inventor: Toshihiko Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 1109 days.

(21) Appl. No.: 10/551,553

(22) PCT Filed: Dec. 22, 2004

(86) PCT No.: PCT/JP2004/019165

§ 371 (c)(1),
(2), (4) Date: Oct. 3, 2005

(87) PCT Pub. No.: WO2005/083515

PCT Pub. Date: Sep. 9, 2005

(65) Prior Publication Data

US 2006/0183310 A1    Aug. 17, 2006

(30) Foreign Application Priority Data

Feb. 26, 2004    (JP) ............................. 2004-052047

(51) Int. Cl.
G03F 1/00    (2006.01)
H01L 21/00    (2006.01)
(52) U.S. Cl. .......................................... 430/311; 430/5
(58) Field of Classification Search .................... 430/5, 430/311
See application file for complete search history.

(56) References Cited

U.S. PATENT DOCUMENTS 4,864,123 A * 9/1989 Mizutani et al. ............. 250/225
5,242,770 A * 9/1993 Chen et al. ..................... 430/5
5,673,103 A    9/1997 Inoue et al.
5,933,219 A * 8/1999 Unno .......................... 355/71
6,128,067 A   10/2000 Hashimoto
6,492,078 B1 * 12/2002 Ohnuma ...................... 430/30
6,685,848 B1 * 2/2004 Sasaki et al. ................. 216/75
2002/0136967 A1 * 9/2002 Sasaki et al. ................... 430/5
2002/0155395 A1 * 10/2002 Nakao ....................... 430/394
2002/0168593 A1   11/2002 Lin (Continued)

FOREIGN PATENT DOCUMENTS

JP        64-67914        3/1989

(Continued)

OTHER PUBLICATIONS

"Immersion Lithography Technology", Nikon Corp. retrieved Feb. 19, 2004, via Internet.

*Primary Examiner*—Mark F Huff
*Assistant Examiner*—Jonathan Jelsma
(74) *Attorney, Agent, or Firm*—McDermott Will & Emery LLP

(57) ABSTRACT

A method of fabricating a semiconductor device including a first wiring pattern extending in a vertical direction and a second wiring pattern identical in geometry to the first wiring pattern and extending in a (horizontal) direction orthogonal to the vertical direction, including the steps of: employing linearly polarized illumination to perform exposure along a mask pattern including mask patterns used to form the first and second wiring patterns, respectively; and subsequently forming the first and second wiring patterns having a geometry along the mask patterns. The mask patterns to form the first and second wiring patterns are formed to be different in geometry.

9 Claims, 18 Drawing Sheets

U.S. PATENT DOCUMENTS

2004/0029024 A1   2/2004   Ohnuma
2004/0080732 A1*  4/2004   Kuroda et al. .................. 355/53

FOREIGN PATENT DOCUMENTS

| JP | 3-210560  | 8/1991 |
| JP | 5-90128   | 4/1993 |
| JP | 6-140306  | 5/1994 |
| JP | 6-275493  | 9/1994 |
| JP | 8-203806  | 8/1996 |
| JP | 2000-3028 | 1/2000 |

* cited by examiner

DIRECTION OF POLARIZATION

DIRECTION OF POLARIZATION

DIRECTION OF POLARIZATION

DIRECTION OF POLARIZATION

DIRECTION OF POLARIZATION

DIRECTION OF POLARIZATION

PROCESS FOR FABRICATING SEMICONDUCTOR DEVICE AND METHOD FOR GENERATING MASK PATTERN DATA

This application is the U.S. National Phase under 35 U.S.C. §371 of International Application No. PCT/JP04/019165, filed Dec. 22, 2004, which in turn claims the benefit of Japanese Application No. 2004-052047, filed Feb. 26, 2004, the disclosures of which Applications are incorporated by reference herein in their entirety.

TECHNICAL FIELD

The present invention relates to semiconductor device fabrication methods and mask pattern data generation methods and particularly to such methods employing lithography using linearly polarized light.

BACKGROUND ART

In fabricating a semiconductor integrated circuit device a fine pattern is transferred on a semiconductor wafer by lithography. In lithography a projection exposure apparatus is typically used and a pattern of a photomask attached on the apparatus is transferred onto the semiconductor wafer to form a pattern of a device.

In recent years there has been a demand for highly integrated devices and the devices' increased speed of operation and in order to meet the demand finer patterns are pursued. Under such circumstance, exposure apparatuses have conventionally been used with a numerical aperture (NA) increased to provide increased resolution.

Furthermore, as a method improving an effective NA a method of exposure referred to as immersion lithography has also been considered. In immersion lithography exposure, a space between a lens and a plane of photoresist serving as a sample to be printed is filled with liquid to increase the space's index of refraction to provide improved effective NA. (As seen from a different point of view, exposure is done with light having a reduced effective wavelength.) A technique associated with immersion lithography is described for example in non-patent Document 1 indicated hereinafter.

Thus there is an increasing demand for increased effective numerical aperture to provide patterns improved in contrast (or resolution). Currently, an apparatus with an NA of 0.9 or higher has been produced as a prototype. Furthermore, an exposure apparatus has also been planed that is combined with immersion lithography to provide an NA as converted of approximately 1.3. It is known that when such an extremely high numerical aperture exposure apparatus is used a pattern transferred significantly varies in contrast depending on the direction of polarization of light employed for exposure.

In general it is known that when polarized light along a direction in which a pattern extends (hereinafter also referred to as S polarized light) is used to provide exposure, a high contrast is obtained. When non-polarized light is used to provide exposure, resolution is reduced. When polarized light perpendicular to the direction in which the pattern extends (hereinafter also referred to as P polarized light) is used to provide exposure, further decreased resolution is provided. This is described for example in Japanese Patent Laying-Open Nos. 6-275493 (Conventional Example 1), 5-90128 (Conventional Example 2), and 6-140306 (Conventional Example 3).

Patent Document 1: Japanese Patent Laying-Open No. 6-275493

Patent Document 2: Japanese Patent Laying-Open No. 5-90128

Patent Document 3: Japanese Patent Laying-Open No. 6-140306

Non-Patent Document 1: "Immersion Lithography Technology", NIKON corp. [made available on Feb. 19, 2004].

DISCLOSURE OF THE INVENTION

Problems to be Solved by the Invention

Such semiconductor device fabrication method as described above, however, has a disadvantage as follows:

As has been described above, the direction of polarization of light for exposure affects the contrast of a pattern formed. As adapting immersion lithography or the like provides improved numerical aperture (NA), exposure's polarization dependency further increases. Consequently, the direction of polarization of light for exposure affects the pattern in geometry and the like and the pattern's geometry as desired may not reliably be obtained.

In contrast, Conventional Examples 1 and 2 disclose a method of exposure for a pattern extending only in one direction. Furthermore, Conventional Example 3 discloses a method of exposure that separately forms mask for forming orthogonal, bi-directional pattern. The example, however, fails to disclose the concept that a dimension is corrected by an amount varied for different directions of the pattern. The present invention is thus distinguished in precondition and configuration from Conventional Examples 1-3.

The present invention has been made to overcome the aforementioned disadvantages and it contemplates a semiconductor device fabrication method and mask pattern data generation method capable of stabilizing in geometry a pattern formed on a wafer.

Means for Solving the Problems

The present semiconductor device fabrication method is a method of fabricating a semiconductor device having a first pattern extending in a first direction and a second pattern identical in geometry to the first pattern and extending in a second direction orthogonal to the first direction, and includes the steps of: employing linearly polarized illumination to perform exposure along a mask pattern including a first and second mask patterns used to form the first pattern and the second pattern, respectively; and subsequently forming the first and second patterns having a geometry along the mask pattern, the first and second mask patterns being different in geometry.

The present mask pattern data generation method is a method of generating mask pattern data defining a mask pattern for forming a pattern on a wafer by linearly polarized light, the method introducing a dimensional correction in an amount varied between a first direction parallel to the linearly polarized light's direction of polarization and a second direction orthogonal to the first direction.

EFFECTS OF THE INVENTION

The present invention can stabilize in geometry a pattern formed on a wafer through exposure.

The foregoing and other objects, features, aspects and advantages of the present invention will become more apparent from the following detailed description of the present invention when taken in conjunction with the accompanying drawings.

DESCRIPTION OF THE REFERENCE SIGNS

1: source of light, 2: mirror, 3: fly eye lens, 4: polarizing plate, 5: mask pattern, 6: fine pattern, 7: photomask, 8: objective lens, 9: wafer, 10: memorymat portion, 11: peripheral circuitry portion, 12: drawn-line portion, 13: line and space pattern, 14, 15: wiring pattern, 16, 17: mask pattern, 18: mask pattern (dimension uncorrected), 19, 20: mask pattern, 21 mask pattern (dimension uncorrected), 22: main pattern (horizontal direction), 23: hammer head (horizontal direction), 24: main pattern (vertical direction), 25: hammer head (vertical direction), 26, 26A: main pattern, 27: subpattern, 28: main pattern (vertical direction) 29: subpattern (vertical direction), 30: main pattern (horizontal direction), 31: subpattern (horizontal direction), 32, 40: halftone field portion, 33, 34: opening, 41, 42: opening, 43: photoresist, 44, 45: hole, 46: abnormally transferred pattern, 50: substrate, 51, 51A, 52, 52A: resist pattern, 101, 102: designed pattern, 103, 104: mask pattern, 105, 106: main portion, 107, 108: projection, 109, 110: inner serif portion (recess), 111, 112: serif portion (protrusion), 113, 114: mask pattern, 113A, 114A: corner, 115A, 115B: main portion, 116A, 116B: projection, 117A, 117B, inner serif portion, 118A, 118B: serif portion, 120:

wafer, 121: insulation layer, 121A, insulation film, 122: conductive layer, 122A: wiring pattern, 123: resist film, 123A: resist pattern.

BEST MODE FOR CARRYING OUT THE INVENTION

Hereinafter the present semiconductor device fabrication and mask pattern data generation methods will be described in embodiments with reference to FIGS. 1-21.

First Embodiment

Figure 1:
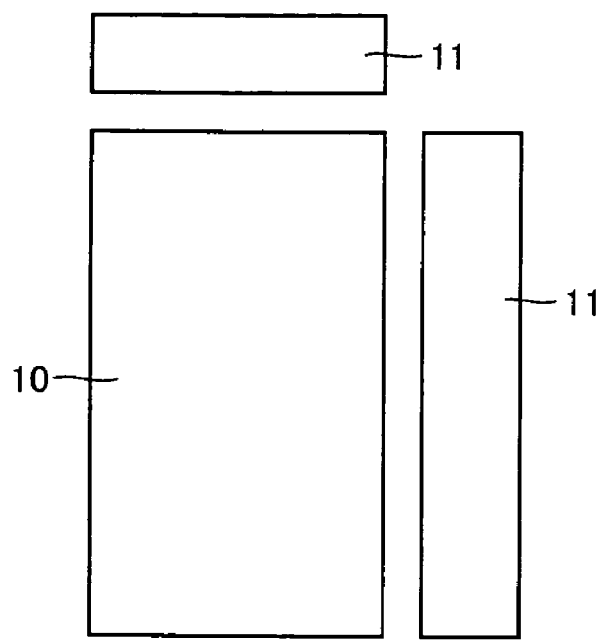
FIG. 1 is a top view schematically showing a configuration of a semiconductor device of the present invention in a first embodiment.

FIG. 1 is a top view of a semiconductor device of the present invention in a first embodiment.

As provided in the present embodiment the semiconductor device is flash memory, one example of non-volatile semiconductor memory device. Note that while in the present embodiment the present invention is described as being applied by way of example to the above flash memory, the present invention is not limited thereto and is applicable to any semiconductor device.

With reference to FIG. 1, the flash memory (or semiconductor device) includes a memorymat portion 10 and a peripheral circuitry portion 11.

Figure 2:
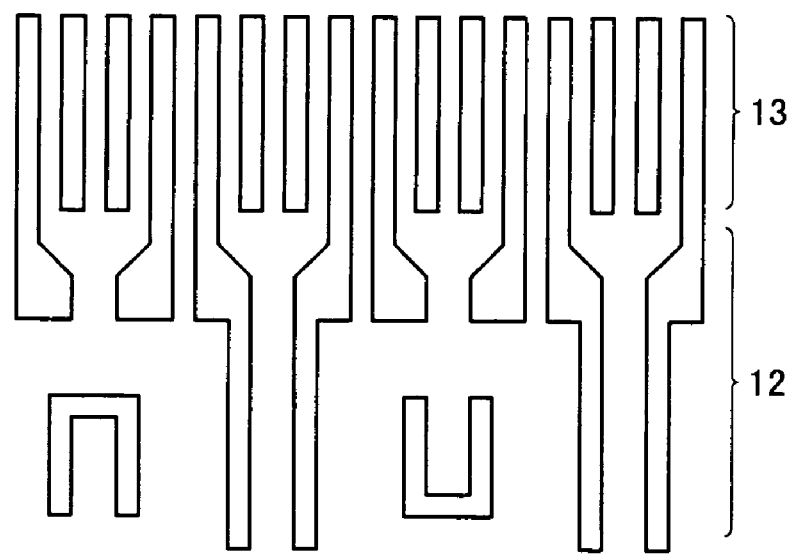
FIG. 2 is a top view of a layout of a pattern in the FIG. 1 semiconductor memory device at a memorymat portion.

FIG. 2 shows one example of a gate wiring pattern of memorymat portion 10.

With reference to FIG. 2, the gate wiring pattern includes a line and space pattern 13 formed on a memory cell and a drawn line portion 12 connected to a contact pad.

Line and space pattern 13 is the densest fine pattern in the flash memory. Note that line and space pattern 13 occupies approximately more than 50% of the entirety of the area of the chip, and reducing line and space pattern 13 in pitch can effectively provide an efficiently reduced chip area (i.e., the chip shrink effect).

Accordingly, linearly polarized light polarized in a direction parallel to that in which line and space pattern 13 extends (linearly polarized light that will be S polarized light for line and space pattern 13), is employed to perform an exposure process. Thus line and space pattern 13 can be increased in resolution and reduced in pitch.

Figure 15:
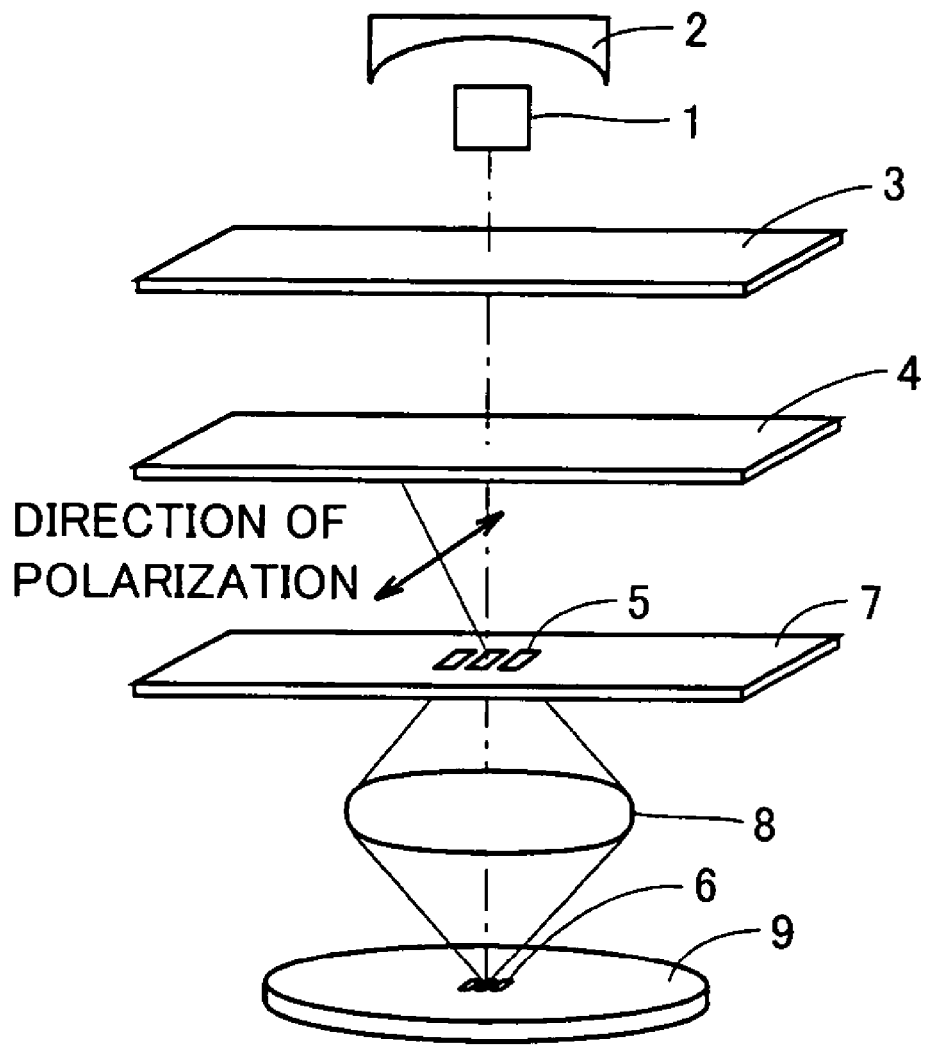
FIG. 15 shows one example of a configuration of a semiconductor fabrication apparatus.

The aforementioned linear polarization light can be obtained by employing linearly polarized illumination. FIG. 15 shows one example of a semiconductor fabrication apparatus including linearly polarized illumination that implements the semiconductor device fabrication method in accordance with the present embodiment.

With reference to FIG. 15, a source of light 1 has a back side facing a mirror 2. The source of light 1 emits light which passes through a fly eye lens 3 to be uniformed and then passes through a polarizing plate 4 to provide linearly polarized light polarizing in a prescribed direction. In the present embodiment, linearly polarized light (S polarized light), polarized along a fine pattern 6 (e.g., line and space pattern 13) on a wafer 9 and a mask pattern 5 employed to form pattern 6, is generated.

The linearly polarized light provided by polarizing plate 4 arrives at a photomask 7 having mask pattern 5. The linearly polarized light passes through photomask 7, and further passes through an objective lens 8 (a projection lens) and arrives at wafer 9. Thus mask pattern 5 is transferred on a resist film deposited on wafer 9.

The FIG. 15 exposure apparatus employs light having a wavelength of 193 nm and a lens with an NA of 0.92 to perform exposure in the atmosphere. It should be noted however that these conditions are exemplary, and for example improving the len's NA and employing immersion lithography to form pattern 6 further reduced in pitch, is of course allowed for. For example, F2 excimer laser can be used to provide exposure to light having a wavelength of 157 nm. Note that if the source of light 1 is an excimer laser, it emits already linearly polarized light. In that case, a λ/4 plate can simply be used to rotate a plane of polarization 90° to switch between S polarization and P polarization.

A typical process for forming a wiring pattern on a wafer will be described with reference to FIGS. 18-21.

Figure 18:
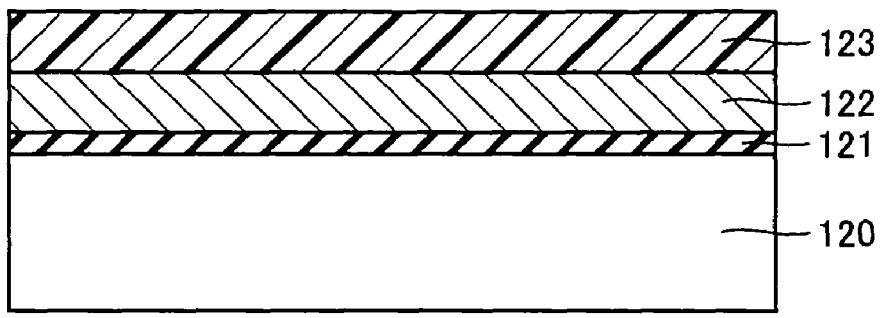
FIG. 18 shows a first step in a typical wiring pattern formation process.
Figure 21:
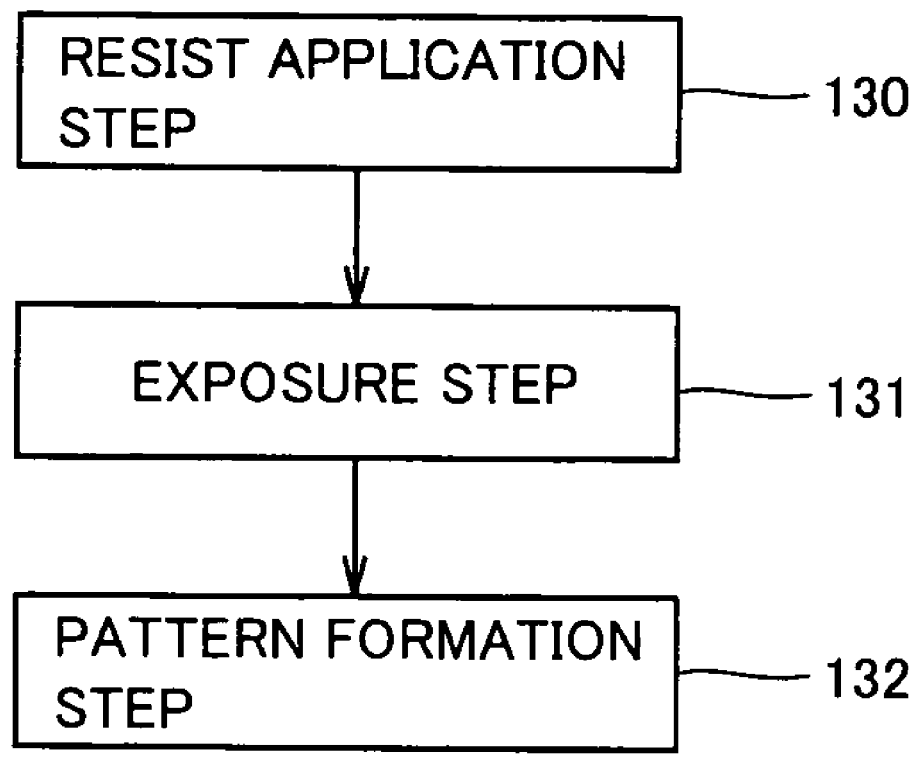
FIG. 21 illustrates a flowchart of the typical wiring pattern formation process.

With reference to FIG. 18, a wafer 120 with an insulation layer 121 and a conductive layer 122 deposited thereon further has a resist film 123 deposited thereon (in FIG. 21 at step 130).

Figure 19:
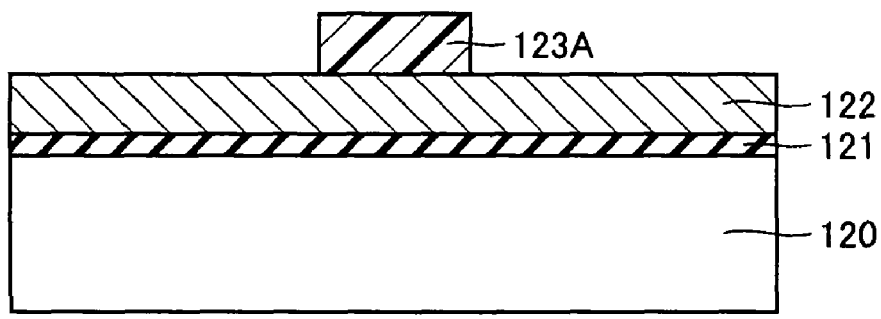
FIG. 19 shows a second step in the typical wiring pattern formation process.
Figure 20:
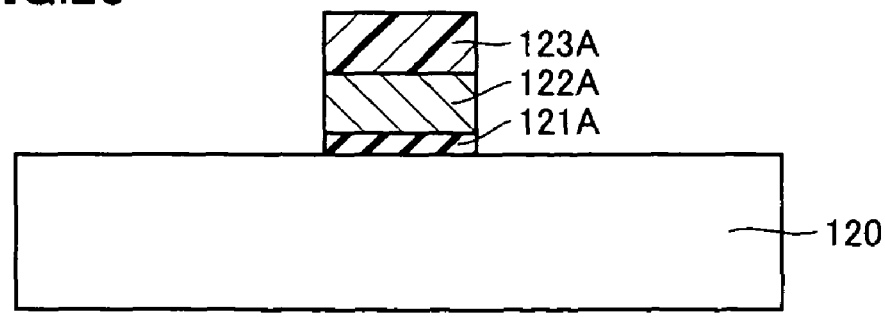
FIG. 20 shows a third step in the typical wiring pattern formation process.

A mask pattern is then used for exposure (in FIG. 21 at step 131). Subsequently a development process is performed to form a resist pattern 123A corresponding to the mask pattern, as shown in FIG. 19.

The intermediate product is etched with resist pattern 123A serving as a mask to form a wiring pattern 122A on wafer 120 with an insulation film 121A interposed therebetween. Subsequently, resist pattern 123A is removed (in FIG. 21 at step 132).

Description will now be made for a method of generating mask pattern data of a photomask employed in the above described exposure process.

Generally, in forming a mask pattern, an amount of variation of the mask pattern that is introduced when it is transferred to a wafer (i.e., an amount of variation of the pattern) is previously considered and the mask pattern having the variation corrected is formed. This approach is referred to as optimal proximity correction (OPC). In this approach a dimension that is corrected will be referred to as an amount of correction in dimension.

If exposure is performed with unpolarized (randomly polarized) light, there is not introduced a dimensional correction varied in amount between vertical and horizontal directions. If exposure is performed with linearly polarized light to form a pattern, however, the pattern varies in resolution between vertical and horizontal directions. As such, if identically dimensioned mask patterns are used to form vertically and horizontally extending patterns, the patterns would have different dimensions in vertical and horizontal directions.

In contrast, the present embodiment provides a mask pattern data generation method introducing a dimensional correction varied in amount between a vertical direction (a first direction) parallel to a direction of polarization of linearly polarized light used to perform exposure and a horizontal direction (a second direction) orthogonal to the vertical direction.

This allows a pattern steady in geometry to be obtained regardless of the direction of polarization of light used for exposure.

Figure 16:
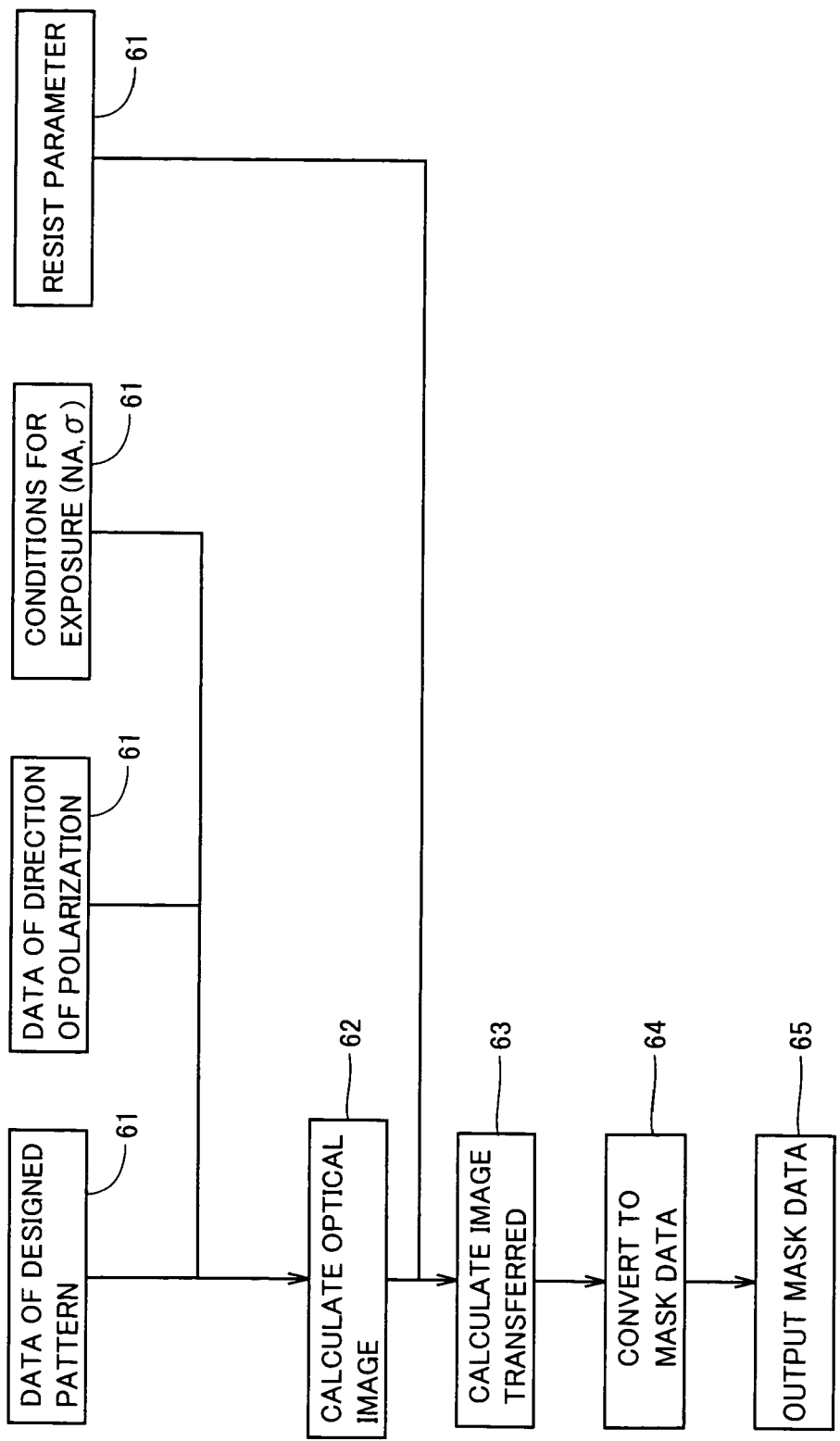
FIG. 16 shows one example of a flowchart of the present mask pattern data generation method in the first embodiment.

FIG. 16 shows a procedure of the mask pattern data generation method in accordance with the present embodiment.

With reference to the figure, data of a pattern to be formed on a wafer ("data of a designed pattern"), data of a direction of polarization of linearly polarized light used for exposure ("data of a direction of polarization"), other conditions for exposure (numerical aperture (NA), illumination's coherence (σ), and information of resist (resist and development parameter) are input (in FIG. 16 at step 61).

When the data of the designed pattern, the data of the direction of polarization, and the conditions for exposure are used to calculate an optical image (in FIG. 16 at step 62). Herein, a relationship between the direction of polarization and that of individual designed pattern is referenced.

The calculated optical image and the above described resist (and development) parameter are used to calculate an image transferred (in FIG. 16 at step 63).

From the image transferred, data of a mask pattern formed on a photomask is obtained (in FIG. 16 at step 64) and calculated mask pattern data is output (in FIG. 16 at step 65).

Figure 17:
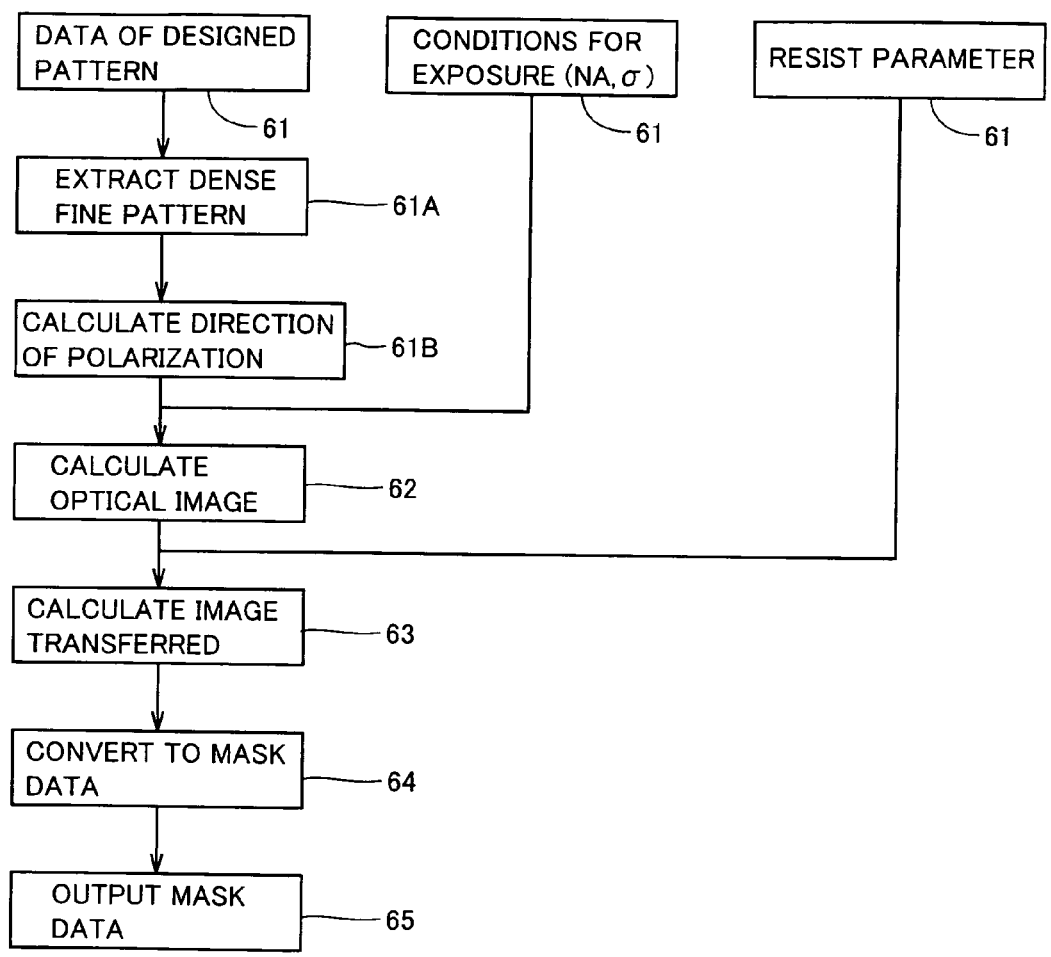
FIG. 17 shows another example of the flowchart of the present mask pattern data generation method in the first embodiment.

FIG. 17 shows the FIG. 16 mask pattern data generation method's procedure in an exemplary variation.

With reference to FIG. 17, in this exemplary variation the finest pattern (a dense fine pattern) in input data of designed patterns is automatically extracted (in FIG. 17 at step 61A) and therefrom a direction of polarization of linearly polarized light used for exposure is defined (in FIG. 17 at step 61B). Thus the above described data of a direction of polarization is automatically obtained, which can eliminate the necessity of entering the data.

Herein the direction of polarization of linearly polarized light is defined as a direction parallel to that in which the dense fine pattern extends. This allows the finest designed pattern to be transferred by using linearly polarized light that serves as S polarized light for the pattern. As a result, the dense fine pattern can be improved in resolution and an effectively reduced chip area can thus be achieved.

Note that in the above described mask pattern data generation method allows for creating an electric design automation (ETA) program that implements steps 61-65.

The above described mask pattern data generation method provides a mask pattern and its effect, as will be described hereinafter.

Figure 3A:
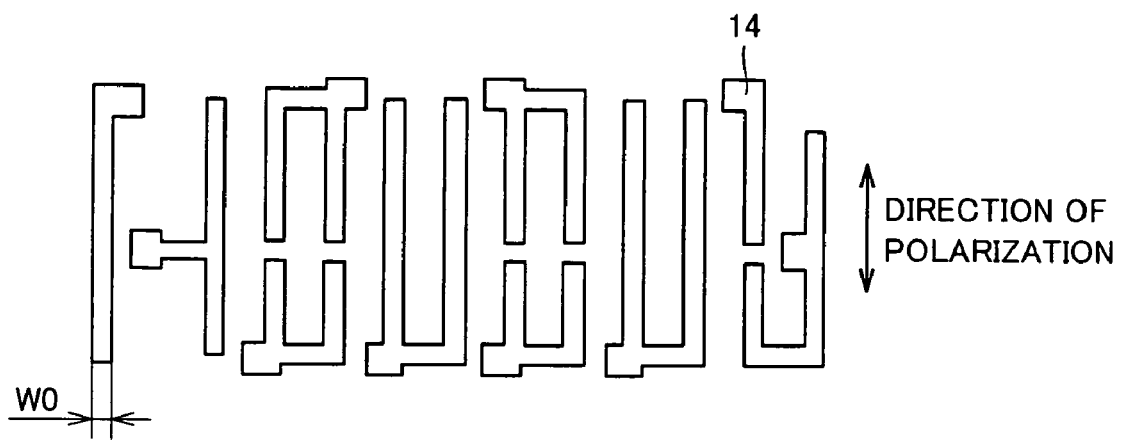
FIG. 3A is a top view of a layout of a gate wiring pattern of a peripheral circuitry portion of the present semiconductor device in the first embodiment, showing a vertical gate pattern.
Figure 3B:
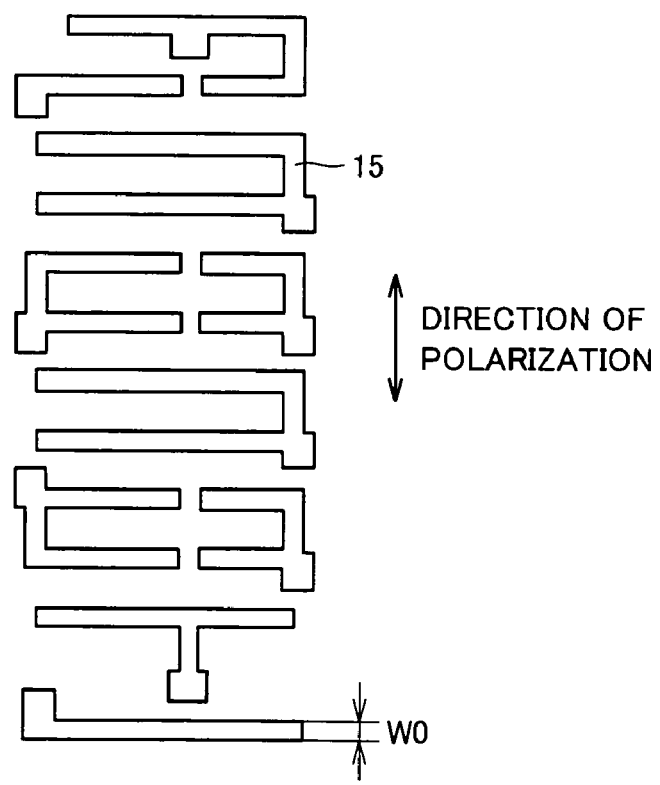
FIG. 3B is a top view of a layout of a gate wiring pattern of a peripheral circuitry portion of the present semiconductor device in the first embodiment, showing a horizontal gate pattern.

FIGS. 3A and 3B show one example of a gate wiring pattern in the above-described flash memory (semiconductor device) at peripheral circuitry portion 11. Note that the FIGS. 3A and 3B patterns are identical. More specifically, the FIG. 3A pattern rotated by 90° corresponds to the FIG. 3B pattern.

With reference to FIGS. 3A and 3B, peripheral circuitry portion 11 is provided with wiring patterns 14, 15 wider in pitch than line and space pattern 13 in memorymat portion 10 aforementioned. More specifically, for example, line and space pattern 13 has a width of approximately 60 nm and a pitch of approximately 120 nm, whereas wiring patterns 14, 15 have a pitch of approximately 240 nm at the narrowest portion.

Wiring pattern 14 (a first pattern) extends in a vertical direction (a first direction) and wiring pattern 15 (a second pattern) extends in a horizontal direction (a second direction). Wiring patterns 14, 15 are equal in width (WO).

Line and space pattern 13 and wiring patterns 14, 15 are formed through an identical exposure process using identical linearly polarized light. The linearly polarized light used to perform exposure has a direction of polarization defined to be parallel to that in which line and space pattern 13 extends. Consequently, the direction of polarization is parallel to that in which wiring pattern 14 extends (in FIGS. 3A and 3B, the vertical direction). In other words, the linearly polarized light serves as S polarized (transverse electric (TE) wave) light for wiring pattern 14 and P polarized (or transverse magnetic (TM) wave) light for wiring pattern 15.

As has been described above, a pattern transferred by S polarized light is higher in resolution than that transferred by P polarized light. As such, when geometrically identical mask patterns are used to provide wiring patterns 14 and 15, they have a dimensional difference of approximately 3 nm.

Figure 4A:
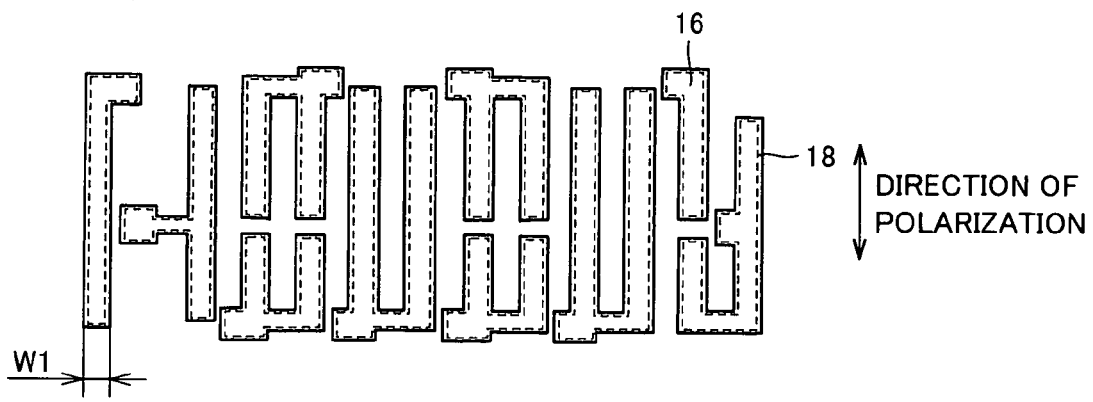
FIG. 4A is a top view of a mask pattern used to form the FIG. 3A wiring pattern.
Figure 4B:
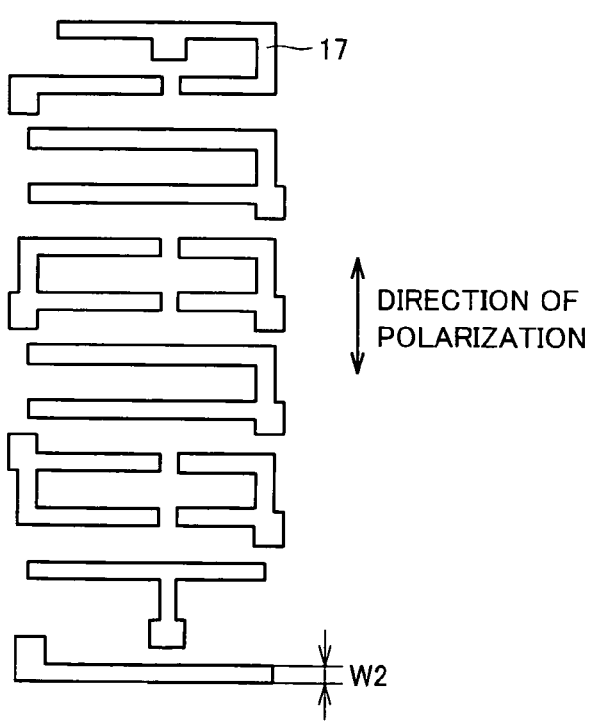
FIG. 4B is a top view of a mask pattern used to form the FIG. 3B wiring pattern.

FIGS. 4A and 4B show mask patterns 16, 17 used to form the FIGS. 3A and 3B wiring patterns 14, 15.

With reference to FIGS. 4A and 4B, wiring pattern 14 formed by S polarized light corresponds to mask pattern 16 (a first mask pattern), which has a width (W1), and wiring pattern 15 formed by P polarized light corresponds to mask pattern 17 (a second mask pattern), which has a width (W2) smaller than width W1. Note that in FIG. 4A a pattern geometrically identical to mask pattern 17 is drawn inside mask pattern 16 as a mask pattern 18 by a broken line. In FIG. 4A mask patterns 16 and 18 provide a horizontal dimensional difference of 16 nm and no vertical dimensional difference.

As has been described previously, wiring pattern 14 formed by S polarized light is higher in resolution than wiring pattern 15 formed by P polarized light, and if wiring patterns 14 and 15 are formed through geometrically identical mask patterns, wiring pattern 14 has a width smaller than wiring pattern 15. This can be addressed by correcting the mask pattern in dimension, as described above, to increase wiring pattern 14 in width and as a result allow wiring patterns 14 and 15 formed on a wafer to be equal in width (WO).

Note that wiring patterns 14 and 15 is larger in pitch than line and space pattern 13, and wiring pattern 15 formed by P polarized light is also sufficiently be resolved. Furthermore, wiring pattern 14 is formed by S polarized light and relatively has a margin for example in depth of focus (DOF), and if mask pattern 16 is increased to be larger in width than mask pattern 17 wiring pattern 14 is still sufficiently be resolved.

As an amount of correction in dimension of a mask pattern is varied according to a relationship between a direction in which a wiring pattern extends and that of polarization, in the memorymat portion a finely pitched gate writing pattern can be formed while in the peripheral circuitry portion a gate pattern can be formed free of a difference in dimension between vertical (first) and horizontal (second) directions and hence as designed.

In a concept similar to the above a dimensionally corrected mask pattern in another example will be described.

Figure 5A:
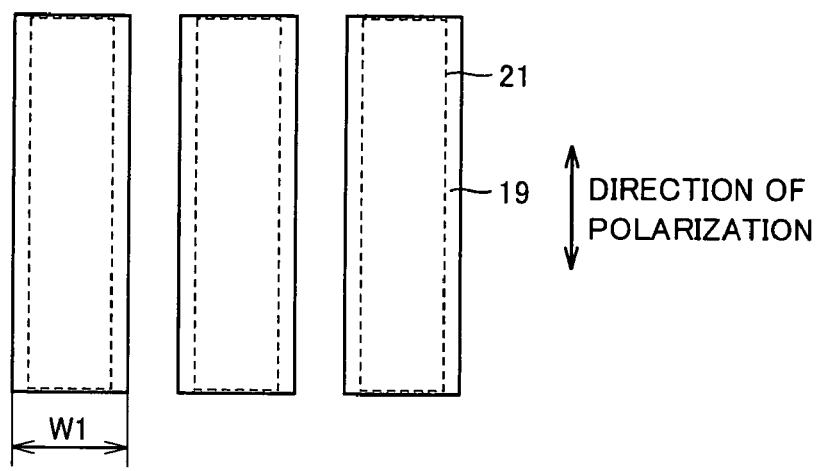
FIG. 5A is a top view of a mask pattern used to form a dense wiring pattern of the peripheral circuitry portion of the present semiconductor device in the first embodiment, showing a vertical mask pattern for forming a vertical dense pattern.
Figure 5B:
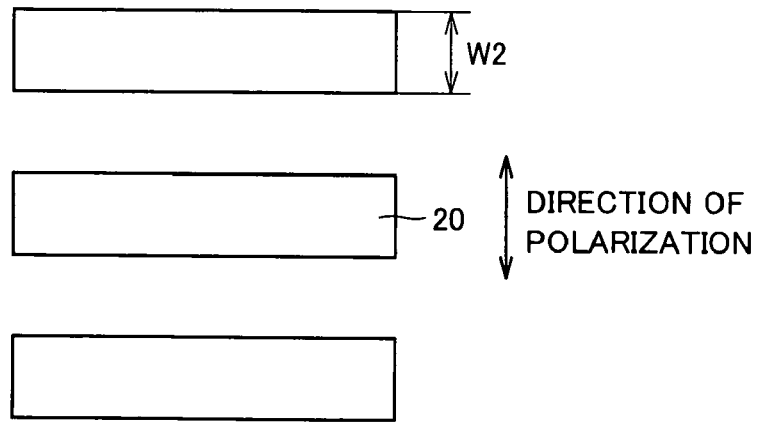
FIG. 5B is a top view of a mask pattern used to form a dense wiring pattern of the peripheral circuitry portion of the present semiconductor device in the first embodiment, showing a horizontal mask pattern for forming a horizontal dense pattern.

FIGS. 5A and 5B show mask patterns 19, 20 used to form a dense pattern in the above described flash memory at the peripheral circuitry portion.

With reference to the figures, a wiring pattern formed by S polarized light corresponds to mask pattern 19 (a first mask pattern), which has a width (W1), and a wiring pattern formed by P polarized light corresponds to mask pattern 20 (a second mask pattern), which has a width (W2) smaller than width W1. Note that in FIG. 5A a pattern geometrically identical to mask pattern 20 is drawn inside mask pattern 19 as a mask pattern 21 by a broken line.

Thus a mask pattern dimensionally corrected by an amount varied between vertical and horizontal directions has allowed the peripheral circuitry portion to have a dense pattern also free of a difference between vertical and horizontal directions and hence as designed.

Figure 6A:
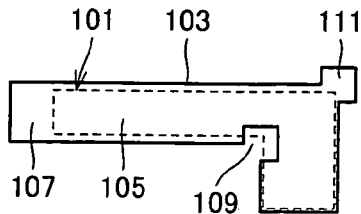
FIG. 6A is a top view of a mask pattern used to form an L-shaped wiring pattern, showing a typical layout of the mask pattern.
Figure 6B:
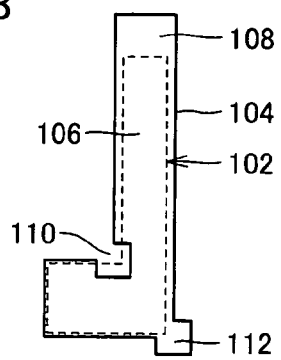
FIG. 6B is a top view of a mask pattern used to form an L-shaped wiring pattern, showing a typical layout of the mask pattern.
Figure 6C:
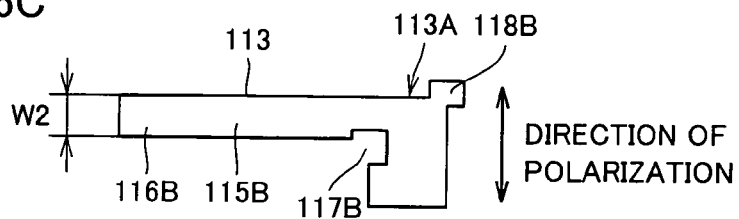
FIG. 6C is a top view of a mask pattern used to form an L-shaped wiring pattern, showing a layout of a mask pattern used in a method of fabricating the present semiconductor device in the first embodiment.
Figure 6D:
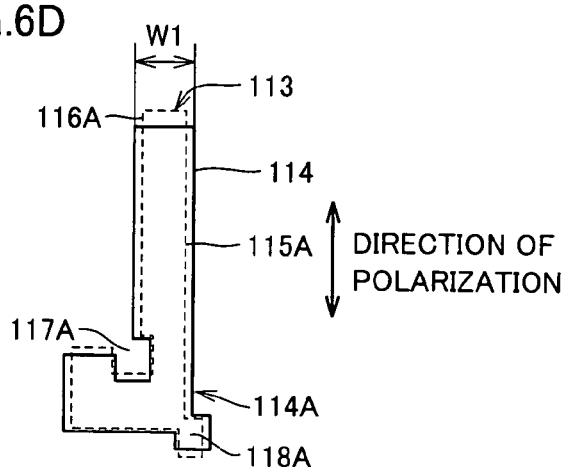
FIG. 6D is a top view of a mask pattern used to form an L-shaped wiring pattern, showing a layout of a mask pattern used in a method of fabricating the present semiconductor device in the first embodiment.

FIGS. 6A-6D show a mask pattern used to form an isolated pattern in the above described flash memory at the peripheral circuitry portion. Note that FIGS. 6A and 6B show a mask pattern used when unpolarized light is used to form the isolated pattern, and FIGS. 6C and 6D show a mask pattern used when linearly polarized light is used to form the isolated pattern.

With reference to FIGS. 6A and 6B, L-shaped designed patterns 101, 102 (indicated by broken line) extending in vertical (first) and horizontal (or second) directions, respectively, are geometrically identical. Designed patterns 101, 102 are formed through mask patterns 103, 104 having main portions 105, 106 and projections 107, 108, and inner serifs 109, 110 (first and second recesses) and serifs 111, 112 (first and second protrusions) inner and outer, respectively, than their respective corners. Note that as designed patterns 101, 102 are formed through an exposure process employing unpolarized light, designed patterns 101, 102 are formed through geometrically identical mask patterns 103, 104.

With reference to FIGS. 6C and 6D, a wiring pattern formed by S polarized light corresponds to a mask pattern 114 (a first mask pattern), which has a width (W1), and a wiring pattern formed by P polarized light corresponds to a mask pattern 113 (a second mask pattern), which has a width (W2) smaller than width W1. Note that in FIG. 6 a pattern geometrically identical to mask pattern 113 is drawn inside mask pattern 114 by a broken line.

As shown in FIGS. 6C and 6D, horizontally and vertically extending mask patterns 113 and 114, respectively, have their respective main portions 115A and 115B different in width, their respective projections 116A and 116B different in amount of projection, their respective inner serif portions 117A and 117B (the first and second recesses) different in geometry, and their respective serif portions 118A and 118B (the first and second protrusions) different in geometry. Vertically and horizontally arranged and geometrically identical designed patterns can thus be formed.

Thus a mask pattern dimensionally corrected by an amount varied between vertical and horizontal directions has allowed an isolated pattern to be also formed free of a difference between vertical and horizontal directions and hence as designed. In contrast, when dimensional correction was made without variation in amount and linearly polarized light was used to perform exposure to form vertical and horizontal patterns, the patterns had a dimensional difference of approximately 3 nm.

Figure 7A:
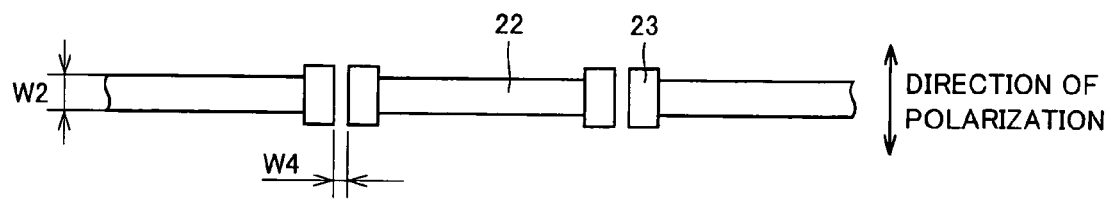
FIG. 7A is a top view of a mask pattern used to form a straight-joint wiring pattern in the present semiconductor device of the first embodiment, showing a vertical mask pattern for forming a vertical matched wiring pattern.
Figure 7B:
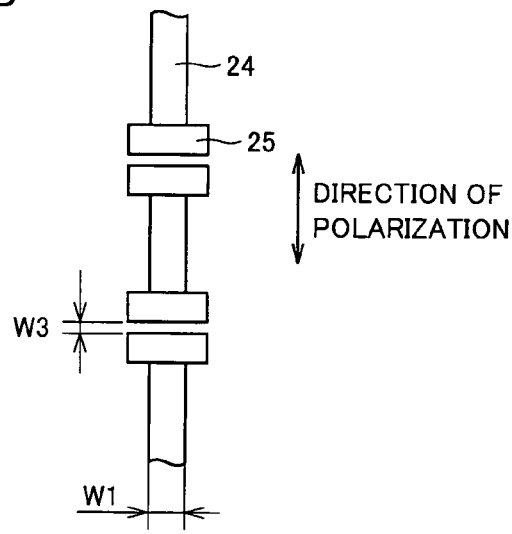
FIG. 7B is a top view of a mask pattern used to form a straight-joint wiring pattern in the present semiconductor device of the first embodiment, showing a horizontal mask pattern for forming a horizontal matched wiring pattern.

FIGS. 7A and 7B show a mask pattern used to form a straight-joint pattern in the above described flash memory at the peripheral circuitry portion.

With reference to the figures, the mask pattern for forming the straight-joint pattern extending in the horizontal direction (second direction) has a main pattern 22 and a hammer head 23 and that for forming the straight-joint pattern extending in the vertical direction (first direction) has a main pattern 24 and a hammer head 25; Herein, main pattern 24 (the first mask pattern), corresponding to a wiring pattern formed by S polarized light, has a width (W1), and main pattern 22 (the second mask pattern), corresponding to a wiring pattern formed by P polarized light, has a width (W2) smaller than width W1, and as well the main patterns, hammer head 25 is increased in width to be larger than hammer head 23. Furthermore, hammer head 25 (the first mask pattern) is increased in thickness and has a spacing (W3) smaller than a spacing (W4) of hammer head 23 (or the second mask pattern).

Thus a mask pattern dimensionally corrected by an amount varied between vertical and horizontal directions has allowed the peripheral circuitry portion to have a straight-joint pattern also free of a difference between vertical and horizontal directions and hence as designed, and also spaced by a small distance.

The present embodiment provides a semiconductor fabrication method summarized as follows:

In the present embodiment the semiconductor device fabrication method in one aspect is a method of fabricating a semiconductor device having a first pattern (e.g., wiring pattern 14 in FIG. 3) extending in a vertical direction (first direction), and a second pattern (e.g., wiring pattern 15 in FIG. 3) having a geometry identical to the first pattern and extending in a horizontal direction (second direction) orthogonal to the vertical direction, including the steps of: employing linearly polarized illumination to provide exposure along a mask pattern including a first mask pattern (e.g., mask pattern 16 in FIG. 4) and a second mask pattern (e.g., mask pattern 17 in FIG. 4) for forming the first and second patterns, respectively; and subsequently forming the first and second patterns (e.g., wiring patterns 14 and 15 in FIG. 3) having a geometry in accordance with the mask pattern, the first and second mask patterns (e.g., mask patterns 16 and 17 in FIG. 4) being formed to be different in geometry. As seen from a different point of view, a mask pattern is dimensionally corrected by an amount varied between vertical and horizontal directions.

Furthermore, in another aspect, the above described first and second mask patterns are different in width, while the first and second patterns have identical widths.

Herein if linear polarization has a vertical direction of polarization, the vertically extending mask pattern (first mask pattern) is increased to be larger in width than the horizontally extending mask pattern (second mask pattern).

As one example of the first and second patterns, L-letter shaped designed patterns 101, 102 (the first and second patterns) are considered. Designed patterns 101, 102 correspond to mask patterns 113, 114, which have corners 113A, 114A, and inner than corners 113A, 114A, inner serif portions 117A, 117B (the first and second recesses) are provided, and outer than the corners serif portions 118A, 118B (the first and second protrusions) are provided. Mask patterns 113 and 114 extending in vertical (first) and horizontal (second) directions, respectively, have their respective inner serifs 117A and 117B different in geometry and their respective serifs 118A and 118B different in geometry.

The first and second patterns may for example be a gate wiring pattern, a dense pattern, an isolated pattern, or, furthermore, a straight-joint pattern.

The present embodiment provides a semiconductor device including a memory cell portion and a peripheral circuitry portion. The above described concept may be implemented in either the memory cell portion or the peripheral circuitry portion.

In the present embodiment the above described concept allows a pattern to be formed with reduced difference in dimension between vertical and horizontal directions and hence as designed.

Second Embodiment

Figure 8A:
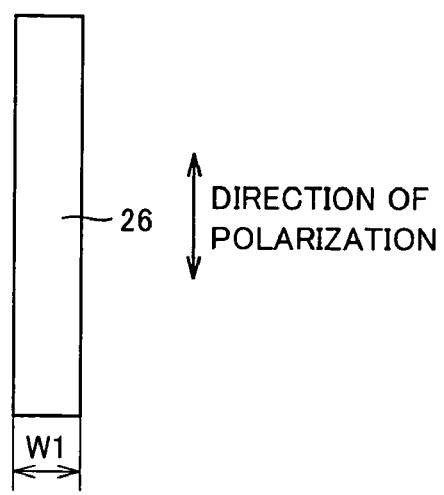
FIG. 8A is a top view of one example of a mask pattern used to form a wiring pattern in the present semiconductor device of a second embodiment, showing a vertical mask pattern for forming a vertical wiring pattern.
Figure 8B:
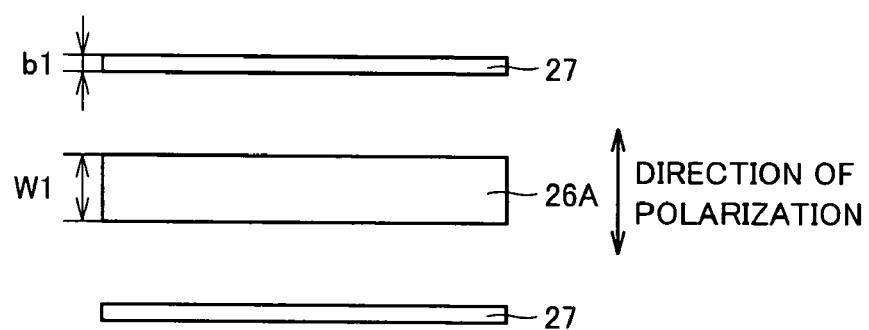
FIG. 8B is a top view of one example of a mask pattern used to form a wiring pattern in the present semiconductor device of the second embodiment, showing a horizontal mask pattern for forming a horizontal wiring pattern.

FIGS. 8A and 8B show a mask pattern used to form a wiring pattern in a flash memory (a semiconductor device) in a second embodiment.

With reference to the figures, a vertical main pattern 26 (first main pattern) corresponding to a wiring pattern formed by S polarized light and a horizontal main pattern 26A (second main pattern) corresponding to a wiring pattern formed by P polarized light are equal in width (W1). It should be noted, however, that horizontal main pattern 26A is sandwiched by a subpattern 27 (a dummy pattern) which is not resolved itself.

More specifically, the main patterns 26, 26A width (W1) is set to 240 nm on a mask, (60 nm as converted for a wafer). When subpattern 27 was absent, main patterns 26, 26A formed vertical and horizontal wiring patterns with a difference in dimension of approximately 2 nm. In contrast, when subpattern 27 was present on the mask, vertical and horizontal wiring patterns were formed without a difference in dimension as well as geometry. Note that subpattern 27 has a width (b1) of approximately 50 nm on the mask.

Figure 9A:
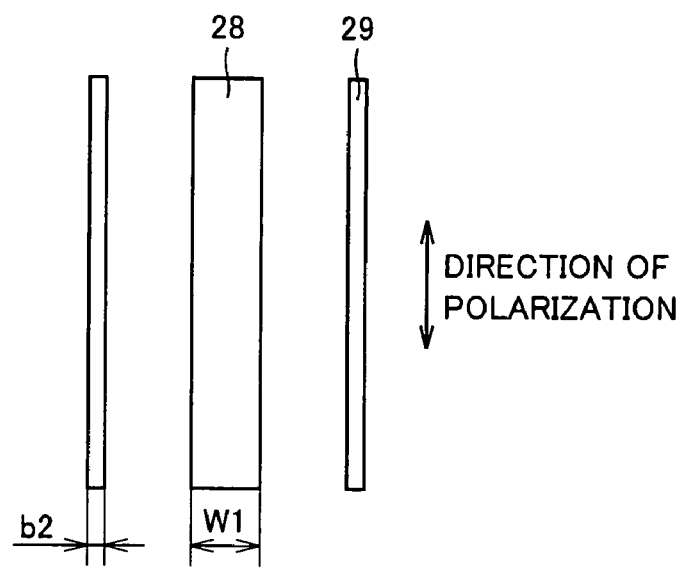
FIG. 9A is a top view of another example of a mask pattern used to form a wiring pattern in the present semiconductor device of the second embodiment, showing a vertical mask pattern for forming a vertical wiring pattern.
Figure 9B:
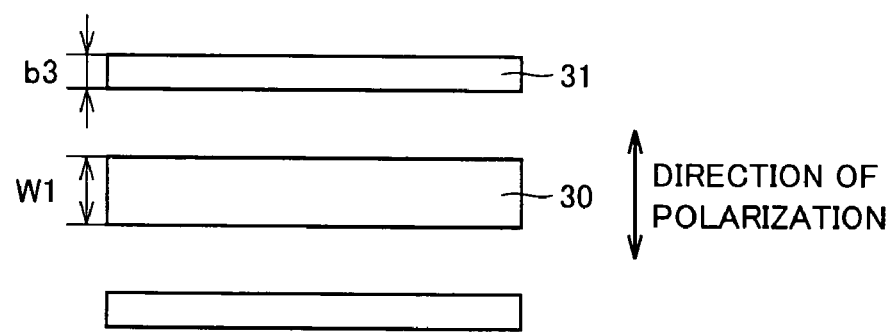
FIG. 9B is a top view of another example of a mask pattern used to form a wiring pattern in the present semiconductor device of the second embodiment, showing a horizontal mask pattern for forming a horizontal wiring pattern.

FIGS. 9A and 9B show an exemplary variation of the FIGS. 8A and 8B mask patterns.

With reference to FIGS. 9A and 9B, a vertical main pattern 28 (first main pattern) corresponding to a wiring pattern formed by S polarized light and a horizontal main pattern 30

(second main pattern) corresponding to a wiring pattern formed by P polarized light are equal in width (W1). Furthermore, vertical main pattern 28 is sandwiched by a subpattern 29 which is not resolved itself, and horizontal main pattern 26A is sandwiched by a subpattern 31 which is not resolved itself More specifically, the main patterns 28, 30 have a width (W1) of 200 nm on a mask, (50 nm as converted for a wafer). Furthermore, subpattern 29 has a width (b2) of approximately 35 nm on the mask and subpattern 31 has a width (b3) of approximately 60 nm on the mask. Subpatterns 29, 31 and main patterns 28, 30 are spaced equally between vertical and horizontal directions. Vertical and horizontal wiring patterns can thus be formed without a difference in dimension as well as geometry.

The present embodiment provides a semiconductor fabrication method summarized as follows:

In the present embodiment the semiconductor device fabrication method is a method of fabricating a semiconductor device having a wiring pattern (a first pattern) extending in a vertical direction (first direction), and a wiring pattern (a second pattern) having the same width as the first pattern and extending in a horizontal direction (second direction) orthogonal to the vertical direction, including the steps of: employing linearly polarized light to transfer a mask pattern formed on a mask onto a resist film formed on a wafer; patterning the resist film; and using the patterned resist mask to form a pattern, and the linearly polarized light has a direction of polarization parallel to the vertical direction (first direction) and to form the second pattern a mask pattern is provided that includes main pattern 26A corresponding to the second pattern and subpattern 27 sandwiching main pattern 26 and smaller in width than main pattern 26A (i.e., b 1<W1).

Main pattern 26A sandwiched by subpattern 27 allows a second pattern extending in the horizontal direction (the direction of P polarization) to be formed with limited width. Consequently, the second pattern can be matched in width to the first pattern extending in the vertical direction (the direction of S polarization), and a pattern can thus be formed with a limited difference in dimension between vertical and horizontal directions and hence as designed.

Furthermore, main pattern 28 (the first main pattern) extending vertically (in the direction of S polarization) that is sandwiched by subpattern 29 (a first subpattern) and main pattern 30 (the second main pattern) extending horizontally (in the direction of P polarization) that is sandwiched by subpattern 31 (a second subpattern), with the subpattern 31 width (b3) greater than the subpattern 29 width (b2), can be as effective as described above.

In the present invention, matters similar to those of the first embodiment will not specifically be described.

Third Embodiment

Figure 10A:
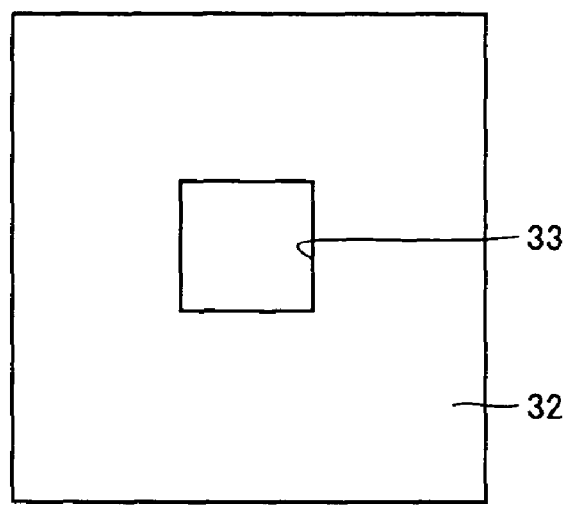
FIG. 10A is a top view of a mask pattern employed to form a hole pattern, showing a typical mask pattern.
Figure 10B:
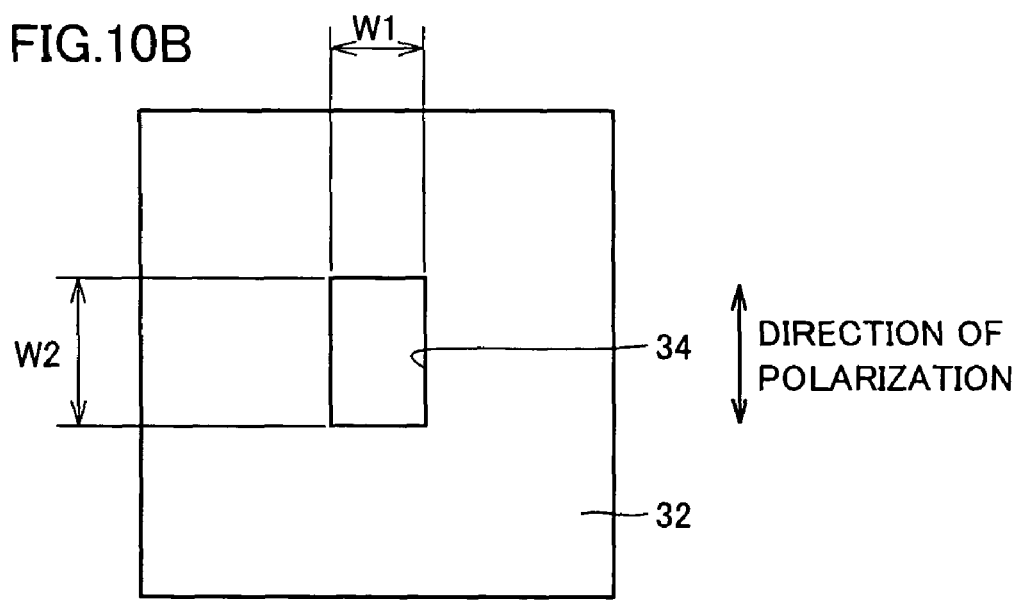
FIG. 10B is a top view of a mask pattern employed to form a hole pattern, showing a layout of the mask pattern that is employed in a method of fabricating a semiconductor device in a third embodiment of the present invention.

FIGS. 10A and 10B are each a top view of a mask pattern employed to form a hole pattern on a wafer.

FIG. 10A shows a typical mask pattern. In the figure the mask pattern includes a halftone field portion 32 (a halftone region) and an opening 33 having a square geometry. Exposing this mask pattern to unpolarized light forms a round hole pattern.

In contrast, FIG. 10B shows a layout of a mask pattern used in a semiconductor device fabrication method in accordance with the present embodiment. In this figure, the mask pattern includes halftone field portion 32 (the halftone region) and an opening 34 having a rectangular geometry with a vertical width (W2) (a first direction) greater than a horizontal width (W1) (the second direction). Exposing this mask pattern to vertically polarized light forms a round hole pattern. Note that in FIG. 10B the rectangle has a ratio between vertical and horizontal dimensions of approximately 1.6. This value, however, can be modified within a range of approximately 1.2 to 2. The ratio set within this range can ensure that abnormal transfer as described later can sufficiently be prevented, and can also prevent a hole pattern formed from having elliptical geometry. Note that light transmitted through halftone field portion 32 is adjusted to have a phase shifted by $\pi$ as compared with that transmitted through openings 34.

Figure 11A:
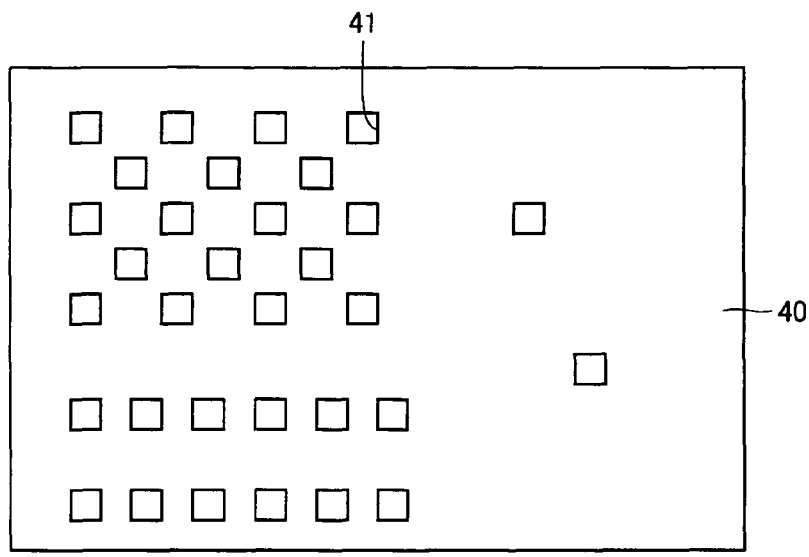
FIG. 11A is a top view of the FIG. 10A mask patterns in a set.
Figure 11B:
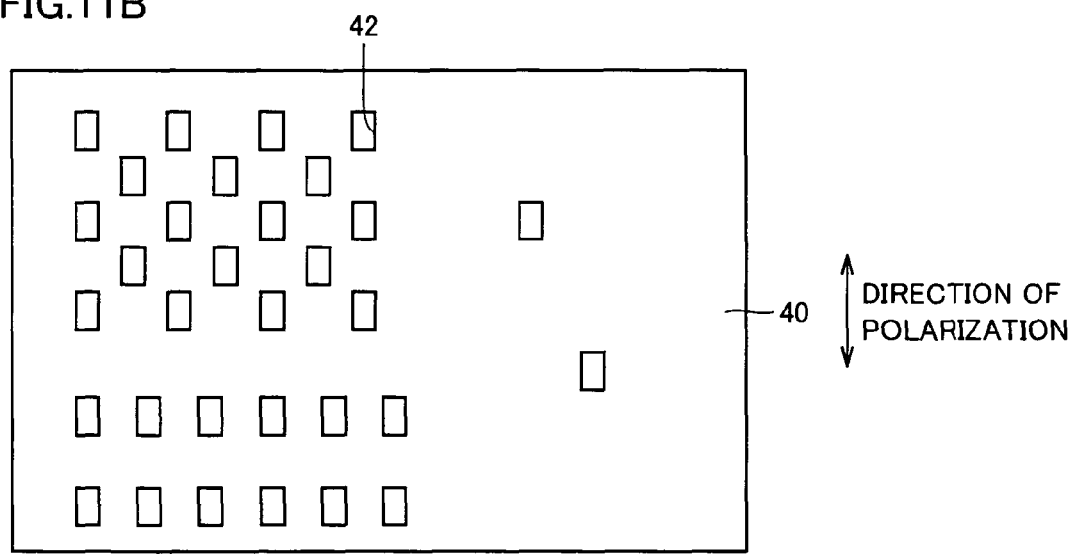
FIG. 11B is a top view of the FIG. 10B mask patterns in a set.

FIGS. 11A and 11B show a plurality of the FIGS. 10A and 10B mask patterns arranged. In FIG. 11A a halftone field portion 40 has a square opening 41 and in FIG. 11B halftone field portion 40 has a rectangular opening 42.

In the first embodiment a mask pattern in a direction (a first direction) in which linearly polarized light used for exposure provides S polarized illumination forms a line larger in width than that in a direction (a second direction) in which the linearly polarized light provides P polarized illumination to form a pattern free of a difference in dimension between vertical and horizontal directions. In the present embodiment, an opening increased in width to be larger in the vertical direction (or the first direction than the horizontal direction (the second direction) i.e., a halftone field portion is reduced in width to be smaller in a direction in which linearly polarized light used for exposure provides S polarized illumination (i.e., the first direction) than a direction in which the linearly polarized light provides P polarized illumination (i.e., the second direction) to form a round hole pattern. Thus the present embodiment provides a mask pattern having a characteristic portion different from the first embodiment.

Thus in the present embodiment a dimensional correction opposite to that in the first embodiment is introduced in order to prevent abnormally transferring a sub peak serving as an obstacle to halftone exposure with improved resolution. The sub peak indicates a spot having high optical intensity caused in the vicinity of an opening by diffraction of light from opening. As it interferes with light diffracted from a neighboring opening it increases in intensity and manifests as an abnormally transferred image.

Figure 12A:
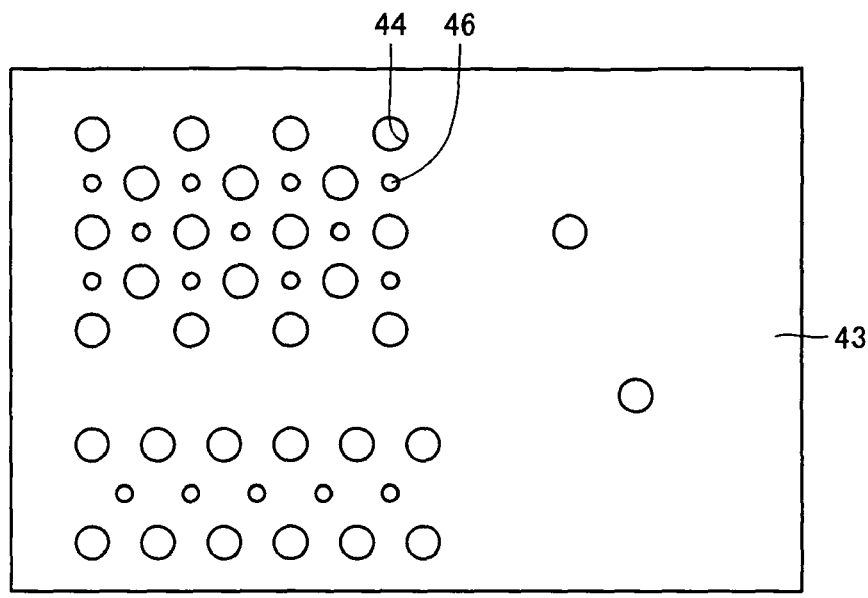
FIG. 12A is a top view showing a result of transferring a pattern by using the FIG. 11A mask patterns.
Figure 12B:
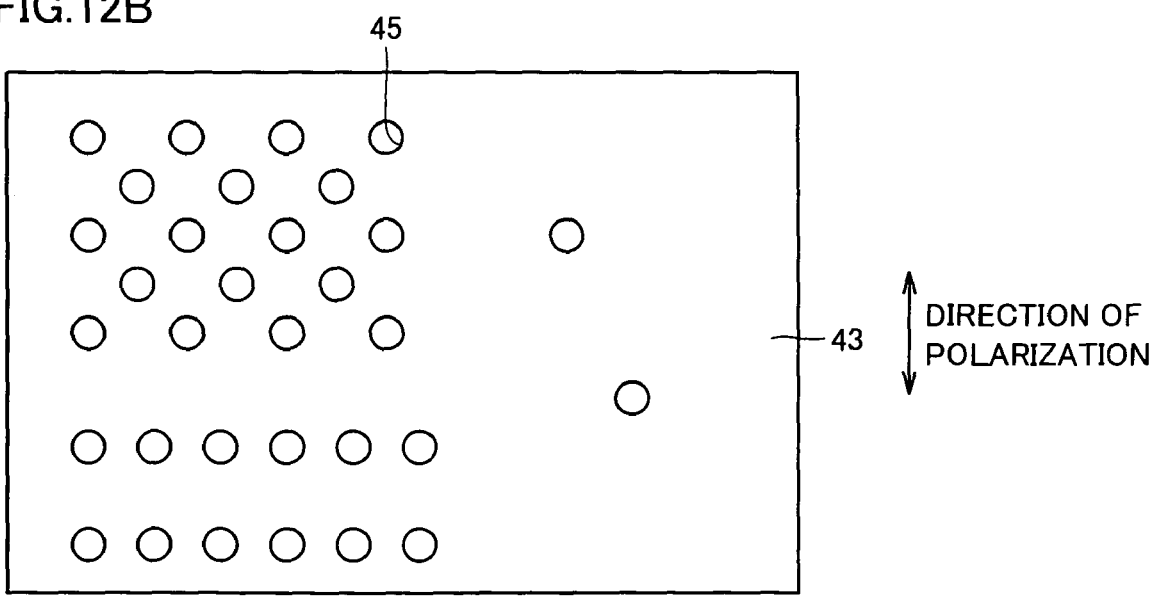
FIG. 12B is a top view showing a result of transferring a pattern by using the FIG. 11B mask patterns.

FIGS. 12A and 12B show patterns on a wafer that are formed through the FIGS. 11A and 11B mask patterns. Note that FIG. 12A shows a pattern formed by exposing the FIG. 11A mask pattern to unpolarized light and FIG. 12B shows a pattern formed by exposing the FIG. 11B mask pattern to linearly polarized light polarized in the vertical direction (first direction).

With reference to FIGS. 12A and 12B, a resist 43 has holes 44, 45 formed therein. In FIG. 12A an abnormally transferred pattern 46 attributed to the sub peak is formed between holes 44. In FIG. 12B, in contrast, there is not an abnormal transfer attributed to a sub peak, since the exposure is performed with linearly polarized light and, as seen in its direction of polarization, the opening is relatively increased in width to provide exposure more efficiently and reduce the opening and field portion's relative exposure ratio.

Note that while in the present embodiment the halftone field portion's transmittance is set to approximately 6%, increasing the transmittance can more effectively prevent abnormal transfer attributed to the sub peak. More specifically, the transmittance can be modified within a range of approximately 2% to 25%.

In the present embodiment a semiconductor device is fabricated in a method summarized as follows:

In the present embodiment the semiconductor device fabrication method is a method of fabricating a semiconductor device having hole 45 (a hole pattern) and includes the steps of: employing linearly polarized light to transfer a mask pattern formed on a mask and including opening 42 onto resist 43 deposited on a wafer; patterning resist 43; and using the patterned resist 43 to form a pattern, and to form hole 45 opening 42 is provided to have a width (W2) in a vertical direction (first direction) parallel to that of polarization of linearly polarized light larger than a width (W1) in a horizontal direction (second direction) orthogonal to the vertical direction.

This can contribute to a limited abnormally transferred pattern formed on the resist that is attributed to the sub peak.

In the present embodiment, matters similar to those of the first and second embodiments will not specifically be described.

Fourth Embodiment

Figure 13A:
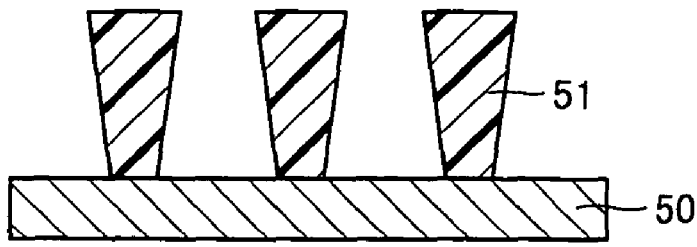
FIG. 13A is a cross section of a resist pattern after a mask pattern is transferred in the present semiconductor fabrication method in a fourth embodiment.
Figure 13B:
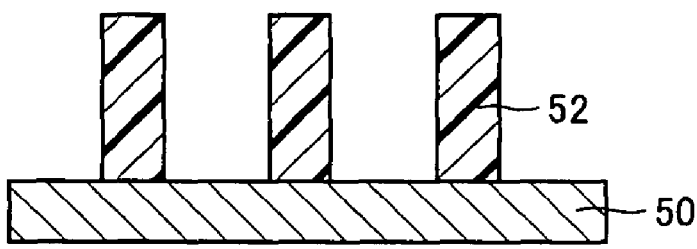
FIG. 13B is a cross section of a resist pattern after a mask pattern is transferred in the present semiconductor fabrication method in the fourth embodiment.
Figure 13C:
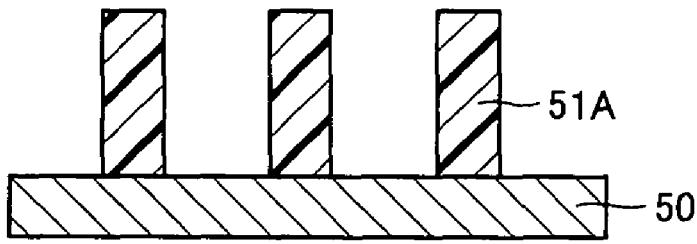
FIG. 13C is a cross section of a resist pattern after a mask pattern is transferred in the present semiconductor fabrication method in the fourth embodiment.
Figure 13D:
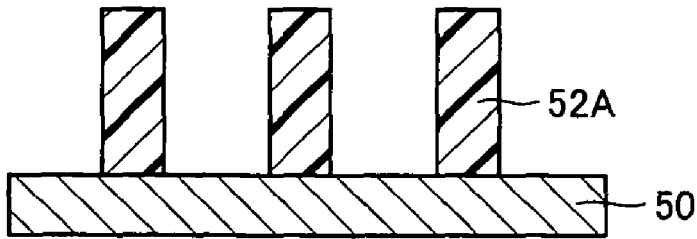
FIG. 13D is a cross section of a resist pattern after a mask pattern is transferred in the present semiconductor fabrication method in the fourth embodiment.
Figure 14A:
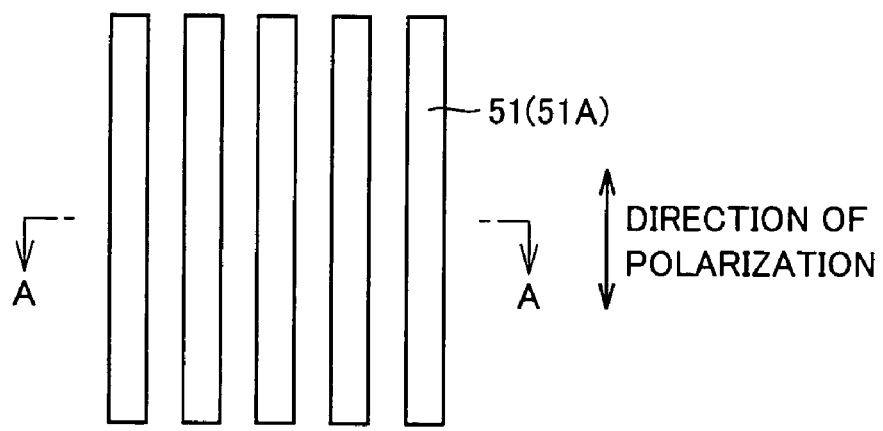
FIG. 14A is a top view of a resist pattern after a mask pattern is transferred in the present semiconductor fabrication method in the fourth embodiment.
Figure 14B:
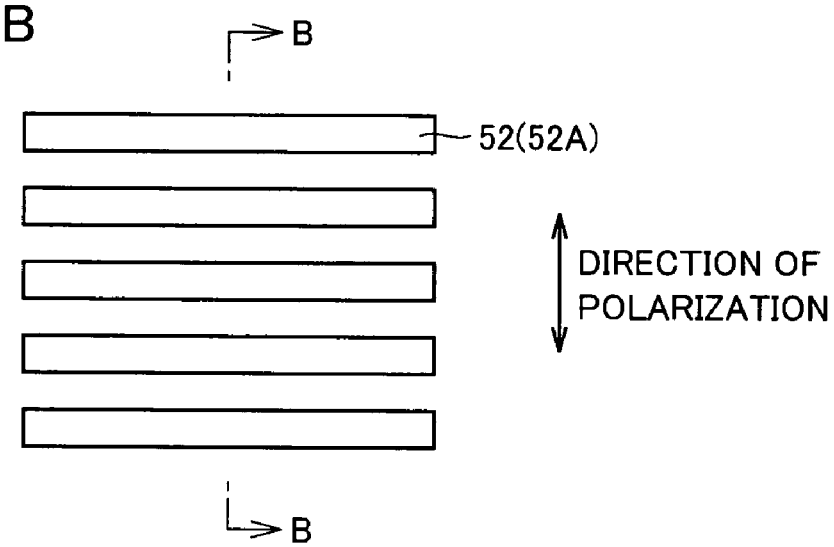
FIG. 14B is a top view of a resist pattern after a mask pattern is transferred in the present semiconductor fabrication method in the fourth embodiment.

FIGS. 13A-13D are cross sections of resist patterns 51, 52, 51A, 52A formed on a substrate 50 in a semiconductor device fabrication method in accordance with a fourth embodiment. FIGS. 14A and 14B are top views of the resist patterns. FIGS. 13A and 13C show a cross section taken along a line A-A in FIG. 14A and FIGS. 13B and 13D show a cross section taken along a line B-B in FIG. 14B.

The FIGS. 13A-13D, and 14A and 14B resist patterns are used to form a line and space pattern having a width of approximately 70 nm. This resist pattern is formed for example with an exposure wavelength of 193 nm and an NA of 0.92 applied as conditions for exposure.

FIGS. 13A and 13B show resist patterns 51, 52 formed when linearly polarized light is used to perform exposure. Note that the linearly polarized light's direction of polarization is a vertical direction in FIGS. 14A and 14B. More specifically, the FIG. 13A resist pattern 51 is formed by S polarized light and the FIG. 13B resist pattern 52 is formed by P polarized light.

With reference to FIGS. 13A and 13B, resist pattern 51 formed by S polarized light tapers in cross section, whereas resist pattern 52 formed by P polarized light is rectangular in cross section.

FIGS. 13C and 13D show resist patterns 51A, 52B formed when linearly polarized light (first linearly polarized light) polarized vertically (in the first direction) and another linearly polarized light (second linearly polarized light) polarized horizontally (in the second direction) combined together are used to perform exposure. Note that the first linearly polarized light's direction of polarization is the vertical direction in FIGS. 14A and 14B and the second linearly polarized light's direction of polarization is the horizontal direction in the same figures. Furthermore, the second linearly polarized light has an amplitude of approximately 5% of that of the first linearly polarized light.

With reference to FIG. 13C, exposing to S polarized light and P polarized light combined together has allowed resist pattern 51A to be formed in a rectangle. Herein it can be ensured that resist pattern 51A is substantially equivalent in resolution to resist pattern 51. Note that resist pattern 52A is geometrically identical to resist pattern 52. Consequently, vertical/horizontal resist patterns' (51A, 52A) difference in dimension as well as geometry can be reduced.

Herein the first linearly polarized light and the second linearly polarized light may be combined together by compositing them to provide elliptically polarized light for exposure or separately directing them for exposure. More specifically, combining the first linearly polarized light and the second linearly polarized light together is a concept including compositing them to provide elliptically polarized light and separately directing them for exposure. The former allows exposure to complete at a time and thus provides increased throughput. The latter allows an optical system for exposure to be configured by a simple device and thus provides a more controllable polarization ratio (i.e., a more controllable ratio in amplitude between the first linearly polarized light and the second linearly polarized light).

Furthermore in the present embodiment the second linearly polarized light is set to have an amplitude of 5% of that of the first linearly polarized light. This value, however, can be modified within a range of approximately 2% to 20% (more preferably approximately 3% to 10%). The first linearly polarized light and second linearly polarized light having their respective amplitudes at a ratio set within this range can ensure that a resist pattern has sufficient resolution and also prevent S polarized light from transferring and forming a resist pattern tapering as seen in cross section.

The present embodiment provides a semiconductor fabrication method summarized as follows:

The method employs an illumination device, a mask and a projective lens and includes the step of employing the device's illumination light to transfer a mask pattern formed on a mask onto a resist film formed on a wafer, the illumination light being S polarized light (first polarized light) polarized in a vertical direction (first direction) parallel to a direction in which the mask pattern extends and P polarized light (second polarized light) polarized in a horizontal direction (second direction) orthogonal to the vertical direction combined together.

In the present invention, matters similar to those of the first to third embodiments will not specifically be described.

Thus the present invention's embodiments described above may have their respective, above described characteristic features combined as appropriate.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

Thus the present invention is applicable to semiconductor fabrication methods and mask pattern data generation methods.

The invention claimed is:

1. A method of fabricating a semiconductor device including a pattern, comprising the steps of:
    employing linearly polarized light to transfer on a resist film formed on a wafer a mask pattern formed on a mask, the transfer performed by a projection exposure method in which a projection lens is disposed between said mask and said resist film;
    patterning said resist film; and
    employing said resist film patterned to form said pattern, wherein
    to form said pattern said mask pattern has an opening larger in width in a first direction parallel to said linearly polarized light's direction of polarization than a second direction orthogonal to said first direction, and
    said pattern is substantially the same width in said first and said second directions.

2. The method of fabricating a semiconductor device according to claim 1, wherein said pattern is a substantially round hole pattern.

3. The method of fabricating a semiconductor device according to claim 1, wherein said opening of said mask pattern is obtained by dimensional correction of a substantially square geometry as a designed pattern.

4. The method of fabricating a semiconductor device according to claim 1, wherein said mask pattern has a halftone region.

5. The method of fabricating a semiconductor device according to claim 1, wherein said first direction is the direction in which said linearly polarized light used for exposure provides S polarized illumination, and said second direction is the direction in which said linearly polarized light used for exposure provides P polarized illumination.

6. The method of fabricating a semiconductor device according to claim 1, wherein said opening has a ratio between said first direction and said second direction within a range of approximately 1.2 to 2.

7. The method of fabricating a semiconductor device according to claim 1, wherein said opening has a ratio between said first direction and said second direction of approximately 1.6.

8. The method of fabricating a semiconductor device according to claim 4, wherein a transmittance of said halftone region is within a range of approximately 2% to 25%.

9. The method of fabricating a semiconductor device according to claim 4, wherein a transmittance of said halftone region is approximately 6%.

* * * * *